United States Patent
Martinez-Perez et al.

(10) Patent No.: US 11,339,940 B2
(45) Date of Patent: *May 24, 2022

(54) LIGHTING MODULE FOR AUTOMOTIVE VEHICLE COMPRISING TWO TYPES OF LIGHT SOURCES

(71) Applicant: VALEO ILUMINACION, Martos (ES)

(72) Inventors: Jose-Ramon Martinez-Perez, Martos (ES); Antonio Domingo Illan, Martos (ES); Jose-David Roldan, Alcala la Real (ES); Miguel-Angel Pena, Illora (ES); Manuel Calmaestra, Martos (ES)

(73) Assignee: VALEO ILUMINACION, Martos (ES)

( * ) Notice: Subject to any disclaimer, the term of this patent is extended or adjusted under 35 U.S.C. 154(b) by 0 days.

This patent is subject to a terminal disclaimer.

(21) Appl. No.: 17/157,299

(22) Filed: Jan. 25, 2021

(65) Prior Publication Data

US 2021/0148537 A1    May 20, 2021

Related U.S. Application Data

(63) Continuation of application No. 16/886,082, filed on May 28, 2020, now abandoned, which is a
(Continued)

(51) Int. Cl.
| | |
|---|---|
| *F21S 43/14* | (2018.01) |
| *H01L 25/075* | (2006.01) |
| *H05K 1/02* | (2006.01) |
| *F21S 43/237* | (2018.01) |
| *F21S 43/249* | (2018.01) |
| *F21S 45/47* | (2018.01) |
| *F21S 43/19* | (2018.01) |

(Continued)

(52) U.S. Cl.
CPC ............. *F21S 43/14* (2018.01); *F21S 43/195* (2018.01); *F21S 43/237* (2018.01); *F21S 43/249* (2018.01); *F21S 45/47* (2018.01); *H01L 25/0753* (2013.01); *H05K 1/021* (2013.01); *B60Q 2400/20* (2013.01); *F21Y 2107/50* (2016.08); *F21Y 2113/13* (2016.08); *H01L 2224/48091* (2013.01);
(Continued)

(58) Field of Classification Search
CPC .................................. F21S 43/14; F21S 45/47
See application file for complete search history.

(56) References Cited

U.S. PATENT DOCUMENTS

| | | | |
|---|---|---|---|
| 7,455,423 B2 | 11/2008 | Takenaka | |
| 7,780,315 B2 | 8/2010 | Gasquet et al. | |

(Continued)

FOREIGN PATENT DOCUMENTS

| | | |
|---|---|---|
| EP | 1860707 | 11/2007 |
| EP | 2161494 | 3/2010 |

(Continued)

*Primary Examiner* — Andrew J Coughlin
(74) *Attorney, Agent, or Firm* — Oblon, McClelland, Maier & Neustadt, L.L.P.

(57) ABSTRACT

A lighting module for an automotive vehicle. The module comprises a support, for example made by a heat dissipation device, and a printed circuit board accommodating at least one light source of a first type. The printed circuit board is housed on the support. The lighting module proposes allowing light sources of a second type, generating, for example, a different amount of heat, to be housed so that the rays arising from the two types of sources may be coupled into one and the same light guide, while efficiently dissipating the heat generated by each of the types of light sources.

17 Claims, 1 Drawing Sheet

Related U.S. Application Data continuation of application No. 15/399,002, filed on Jan. 5, 2017, now Pat. No. 10,731,820.

(51) Int. Cl.
*F21Y 113/13* (2016.01)
*F21Y 107/50* (2016.01)
*H05K 1/18* (2006.01)

(52) U.S. Cl.
CPC ...... *H01L 2224/48464* (2013.01); *H05K 1/18* (2013.01); *H05K 2201/10106* (2013.01)

(56) References Cited

U.S. PATENT DOCUMENTS

| | | | |
|---|---|---|---|
| 8,764,257 | B2 | 7/2014 | de Lamberterie |
| 9,121,566 | B2 | 9/2015 | de Lamberterie |
| 2006/0245188 | A1 | 11/2006 | Takenaka |
| 2007/0268703 | A1 | 11/2007 | Gasquet et al. |
| 2009/0116252 | A1 | 5/2009 | Kille et al. |
| 2009/0296418 | A1 | 12/2009 | Luo |
| 2011/0007518 | A1 | 1/2011 | de Lamberterie |
| 2011/0007818 | A1 | 1/2011 | Yagasaki |
| 2012/0134133 | A1 | 5/2012 | Kang |
| 2014/0218969 | A1 | 8/2014 | Kjaer |
| 2014/0247617 | A1 | 9/2014 | de Lamberterie |
| 2017/0211761 | A1 | 7/2017 | Kuriki |

FOREIGN PATENT DOCUMENTS

| | | |
|---|---|---|
| EP | 2270389 | 1/2011 |
| EP | 2826668 | 1/2015 |
| JP | 2002368279 | 12/2002 |
| JP | 2011090903 | 5/2011 |
| WO | 2015092034 | 6/2015 |

LIGHTING MODULE FOR AUTOMOTIVE VEHICLE COMPRISING TWO TYPES OF LIGHT SOURCES

CROSS-REFERENCE TO RELATED APPLICATIONS

This application is a continuation of U.S. application Ser. No. 16/886,082, filed May 28, 2020, which is a continuation of U.S. application Ser. No. 15/399,002, filed Jan. 5, 2017, which claims priority to the French application 1650201 filed on Jan. 11, 2016, which application is incorporated herein by reference and made a part hereof.

BACKGROUND OF THE INVENTION

1. Field of the Invention

The invention relates to the field of lighting and light signaling, especially for automotive vehicles.

2. Description of the Related Art

In the field of lighting and light signaling for automotive vehicles, it is becoming increasingly common to use light sources based on light-emitting semiconductor components, for example, light-emitting diodes (LEDs). An LED component emits light rays when a voltage with a value that is at least equal to a threshold value, referred to as direct voltage, is applied to its terminals.

In a known manner, one or more LEDs of a lighting module for an automotive vehicle are supplied with power via means for controlling the power supply, which comprise converter circuits. The means for controlling the power supply are configured to convert an electric current of a first magnitude, for example delivered by a current source of the automotive vehicle, such as a battery, to a load current having a second magnitude which is different from the first.

The light emitted by an LED may, in a known manner, be coupled into a light guide having an entry face, through which the light rays emitted by the LED enter the guide, and an entry face, physically located a distance away from the entry face, through which the light rays leave the light guide. Between the entry face and the exit face, the light rays are guided within the light guide, typically using reflective elements positioned inside the light guide.

Different LEDs, capable, for example, of emitting light of different color or intensity, may be used in order to carry out different lighting functions of an automotive vehicle within one and the same lighting device. These may be, for example, the functions of high beam or turn indicator lights. These LEDs implementing different lighting functions may nonetheless be supplied with power and controlled by shared power supply and control circuits, thus decreasing the need to provide dedicated electronic circuits. However, coupling the light produced for various lighting functions into various light guides remains a space constraint in the design of lighting devices for an automotive vehicle.

It should be noted that various types of LEDs housed on one and the same printed circuit board generate different amounts of heat when they are in operation, and the heat generated may also depend on the lighting function carried out by the LEDs. Specifically, a turn indicator light or blinker emits light only intermittently. The same applies for the generation of heat associated therewith. However, an LED producing a high-luminosity daytime running light generates a more substantial amount of heat. In general, heat dissipation elements are used in order to avoid overheating the LEDs. In order to guarantee efficient thermal dissipation, these elements are, in a known manner, often oversized according to the LEDs of the lighting device which generate the most heat. This leads to an additional loss of efficiency and wasted space.

SUMMARY OF THE INVENTION

An aim of the invention is to propose a solution that overcomes at least one of the aforementioned problems. More particularly, an aim of the invention is to propose a lighting module involving multiple types of light sources.

A subject of the invention is a lighting module for an automotive vehicle. The lighting module comprises a support and a printed circuit board accommodating at least one light source of a first type. That is to say the light source of a first type is mounted on the printed circuit. The printed circuit board is housed on the support. The lighting module is noteworthy in that it comprises at least one light source of a second type housed directly on the support. The arrangement of the light sources is such that the light sources of the first type and of the second type are capable of emitting light rays in the direction of an entry face of one and the same light guide of the module.

Preferably, the module may comprise a larger plurality of types of light sources, for example three, four or more types of light sources. Each type of light source beyond the two types of light sources may be housed either on a printed circuit board, as for the first type of light sources, or directly on the support, as for the second type of light sources.

Preferably, the printed circuit board may comprise at least one through-window, giving access to the support. The light source of the second type may preferably be housed on the support at the location corresponding to the window of the printed circuit board. Alternatively, the printed circuit board may comprise an edge, and the light source of the second type may be housed on the support in the vicinity of the edge.

Preferably, the light sources of the second type may be electrically connected to the printed circuit board.

The connection between the light source of the second type and the printed circuit board may preferably be made via bridging by a metal wire. Alternatively, the connection may be made via bridging by a metal strip.

Preferably, the light sources of the first and of the second type may be supplied with electricity by shared means for controlling the power supply. The control means may preferably be arranged to selectively supply power to the light sources of the first and of the second type.

The printed circuit board may preferably be fixed to the support by crimping or by bonding.

Preferably, the light source of the second type may be fixed to the support by bonding.

The bonding may preferably be carried out using a thermally conductive adhesive.

Preferably, the support may comprise means for dissipating the heat of the module. The support may preferably comprise a base bearing the light source of the second type, the heat dissipation means potentially comprising, for example, fins extending perpendicularly to the base.

Preferably, the support comprises a generally planar surface of a heat dissipation element of the module. The heat dissipation means may preferably comprise a radiator made of a thermally conductive material.

The heat dissipation means may preferably comprise aluminum.

The light source of the first type may preferably be capable of emitting light of a first color, for example the color amber. The light source of the second type may preferably be capable of emitting light of a second color, for example the color white.

Preferably, the light source of the first type may be intended to carry out a first lighting function, for example the function of turn indicator. Preferably, the light source of the second type may be intended to carry out a second lighting function, for example the function of daytime running lights.

The light guide may preferably be arranged such that the light relating to the first and second lighting functions exits through the shared exit face. Advantageously, the light source of the second type is additionally intended to carry out a third lighting function, for example the function of position light, when it is under-energized.

The light sources may preferably be semiconductor element light sources, for example light-emitting diode (LED) light sources.

Preferably, the light sources and the light guide may be arranged so that the light source of the first type is capable of emitting light rays in the direction of a first entry face of the light guide, and so that the light source of the second type is capable of emitting light rays in the direction of a second entry face, different from the first entry face, of the same light guide.

Alternatively, the light sources and the light guide may be arranged so that the light sources of the first and of the second type are capable of emitting light rays in the direction of one and the same entry face of the light guide.

The measures of the invention are advantageous in that light sources of multiple different types, corresponding, for example, to light-emitting diodes (LEDs) of different colors and carrying out different lighting functions of an automotive vehicle, may be positioned so as to be physically close to one another in a lighting module. This has the advantage that the light rays emitted by the various types of LEDs may be coupled into a shared light guide, thus decreasing the need to provide individual light guides per lighting function. According to one preferred embodiment, LEDs generating a substantial amount of heat, corresponding, for example, to the LEDs carrying out the function of daytime running lights of an automotive vehicle, are housed directly on a heat dissipation element, while LEDs generating a small amount of heat are housed on a printed circuit board borne by the heat dissipation element. By providing a pre-cut window in the surface of the printed circuit board, the two types of LEDs in question may be physically close to one another. By additionally providing an electrical connection of bridging or wire bonding type, all of the LEDs may be supplied with electricity by shared electrical power supply means.

These and other objects and advantages of the invention will be apparent from the following description, the accompanying drawings and the appended claims.

BRIEF DESCRIPTION OF THE ACCOMPANYING DRAWINGS

Other features and advantages of the present invention will be better understood with the aid of the description and the drawings, in which.

DETAILED DESCRIPTION OF THE PREFERRED EMBODIMENTS

Figure 1:
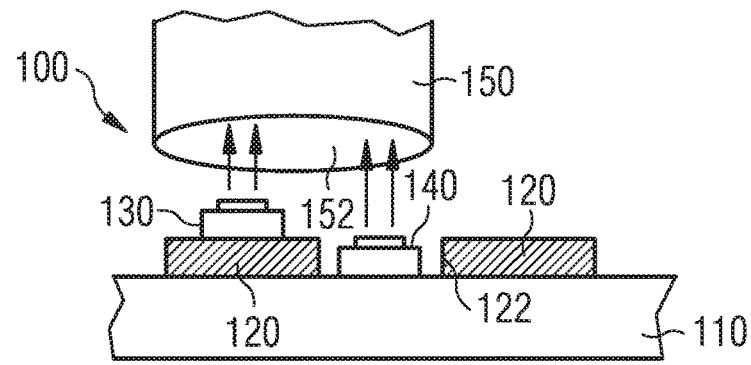
FIG. 1 shows a schematic illustration of a lateral cross section through a module according to one preferred embodiment of the invention.

In the following description, similar reference numerals are used to describe similar concepts across the various embodiments of the invention. Thus, the reference numerals 100, 200 describe a lighting module in two different embodiments according to the invention.

Unless specified otherwise, technical features that are described in detail for one given embodiment may be combined with the technical features that are described in the context of other embodiments described by way of non-limiting example.

The elements shown in the drawings are not to scale and are simplified in order to enhance the clarity of the account.

FIG. 1 shows, in a schematic lateral cross section, a lighting module 100 according to the invention, in which only the components that relate directly to the invention are shown. A printed circuit board 120 accommodates an electronic circuit additionally comprising at least one light source 130. The light source 130 is of a first type and it is, for example, a light-emitting diode (LED).

The printed circuit board 120 is housed on a support 110 of the lighting module 100. At least one light source, for example of LED type, of a second type 140, is positioned directly on a surface of the support 110, and not on the printed circuit board 120. The printed circuit board 120 comprises a through-window 122 or a bay cut out of one of its edges, so that the substrate of the printed circuit board 120 at least partially surrounds the light sources of the second type 140. The light sources of the first type 130 and of the second type 140 may, for example, differ in the color of the light emitted, or in the lighting function that they are intended to carry out within the lighting module 100. Combinations of these differences and other distinctive attributes are conceivable without departing from the scope of the invention.

The lighting module 100 also comprises a light guide 150 that comprises an entry face 152, intended to couple light rays incident thereto, and to guide them toward an exit face (not illustrated). Such light guides 150 are known in the art; they may, for example, comprise multiple entry faces. The light rays are guided inside the light guide 150 by means of the principle of total reflection off the internal walls of the light guide 150. A light guide 150 allows, in particular, light rays to be emitted at a location a distance away from the light source 130, 140 from which they arise. According to the invention, the arrangement of the light sources 130, 140 is such that the light sources of the first type 130, housed on the printed circuit board 120, and the light sources of the second type 140, housed on the support 110, are capable of emitting light rays in the direction of an entry face 152 of the light guide 150.

The printed circuit board (PCB) 120 is preferably a circuit printed on a generally planar and rigid substrate. The substrate is, in a known manner, fashioned from an epoxy resin. The through-window or bay 122 may be incorporated during the injection molding of the substrate or, alternatively, it may be made by removing the corresponding material once the substrate has been produced. The printed circuit board 120 may alternatively be a flexible printed circuit board (FPCB) or a printed circuit board with a complex geometry of MID (molded interconnect device) type.

Figure 2:
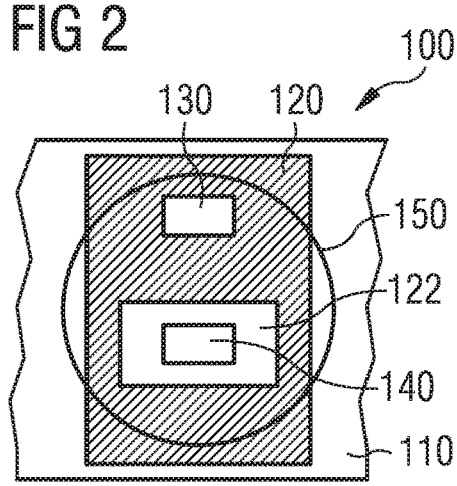
FIG. 2 shows a schematic illustration of a top view of a module according to one preferred embodiment of the invention.

The top view of FIG. 2 shows the example of the through-window or bay 122 surrounding a light source 140 of the second type, positioned on the support 110. Advantageously, the support 110 is a heat dissipation element, preferably made of aluminum, and comprises a generally planar surface to which the printed circuit board 120 and the light sources 140 of the second type are fixed. The fixing is, for example, achieved using a thermal adhesive. The printed circuit board 120 may alternatively be fixed to the heat dissipation element by crimping, by means of crimping pins provided for this purpose on the surface. The heat dissipation element is, for example, a radiator.

In one preferred non-limiting embodiment, the light sources of the first type 130 are LEDs that are able to emit amber-colored light. These light sources 130 carry out the function of blinker, or turn indicator, of an automotive vehicle and therefore operate only intermittently, thus generating relatively little heat. The light sources of the second type 140 are LEDs that are able to emit white-colored light. These light sources 140 carry out, for example, the function of daytime running lights and generate a more substantial amount of heat over extended periods of time. The invention allows these light sources 140 to be positioned in direct contact with the heat dissipation element or support 110, thus guaranteeing an effective exchange of heat, while all of the other electronic components may be housed on the printed circuit board 120, thereby facilitating their placement when manufacturing the lighting module 100. The two types of light sources 130, 140 may nonetheless be positioned so as to be physically close to one another, so that the light rays arising from the two types of light sources 130, 140 may be coupled into one and the same light guide 150, even though the area of its entry face 152 does is not substantial. This has advantages in terms of saving space within the lighting module 100, allowing advantageous designs to be produced. Specifically, depending on the chosen lighting function, one and the same exit face of the light guide 150 may emit either white light rays or amber-colored light rays.

In one preferred embodiment, the light sources of the first and of the second type 130, 140 are supplied with electricity by a shared circuit for controlling the power supply. The electronic components making up this circuit may be housed on the printed circuit board 120, or on a printed circuit board physically located a distance away from the printed circuit board 120 and connected thereto by conductive wires. In order to achieve this configuration, the light sources of the second type 140 are advantageously electrically connected to an electronic circuit housed on the printed circuit board 120.

Figure 3:
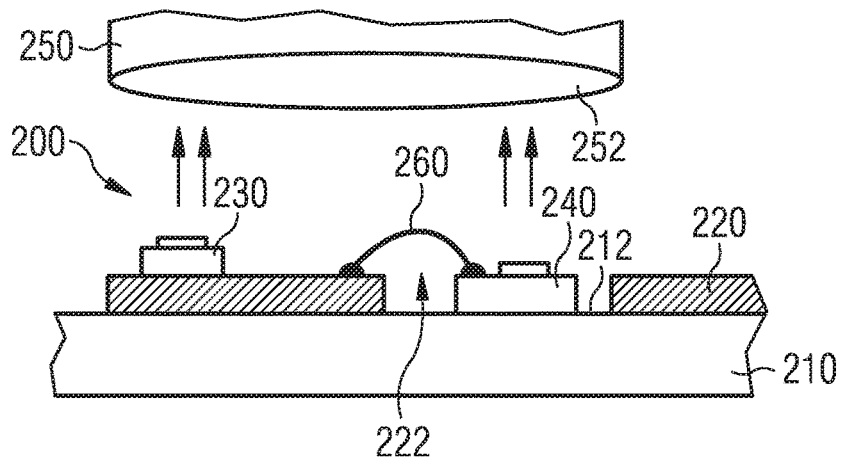
FIG. 3 shows a schematic illustration of a lateral cross section through a module according to one preferred embodiment of the invention.

FIG. 3 shows one particular preferred embodiment of the lighting module 200 according to the invention in schematic lateral cross section. A printed circuit board 220 accommodates an electronic circuit additionally comprising at least one light source 230. The printed circuit board 220 is housed on a support 210 of the lighting module 200. At least one light source of a second type 240 is positioned directly on a surface 212 of the support 210. The printed circuit board 220 comprises a through-window 222, so that the substrate of the printed circuit board 220 at least partially surrounds the light sources of the second type 240. The lighting module 200 also comprises a light guide 250 that comprises an entry face 252, intended to couple light rays incident thereto, and to guide them.

The light-emitting diodes or light sources 240 of the second type are electrically connected to the electronic circuit of the printed circuit board 220 via metal wires 260 forming bridges between contact lands of the printed circuit board 220 on the one hand, and corresponding contact lands of the diodes or light sources 240. These wires 260 are soldered to these lands using ultrasound. This technique is commonly referred to as "wire bonding" or "bridging". It is a technique commonly used for making the electrical connections between the package and the chip of an integrated circuit. The bond is simply achieved via a wire (or bridge) soldered between the two connection pads that are provided for this purpose on each of the elements. The soldering is generally carried out using ultrasound. The material of the wire is aluminum, gold or copper. The diameter of the wire may be between 75 µm and 250 µm.

The wire bonding technique facilitates the placement of the various components when manufacturing the lighting module 200. In a first step, the light sources of the second type 240 are positioned on and fixed to the support 210, which is preferably a heat sink. Next, the printed circuit board 220, populated with electronic components beforehand, including light sources of the first type 230, is positioned on and fixed to the support 210. The arrangement is such that the through-bay or window 222 of the printed circuit board 220 surrounds the location of the light sources 240 of the second type. Next, the electrical connection between the light sources 240 of the second type and the printed circuit board 220 is made via bridging.

While the system, apparatus, process and method herein described constitute preferred embodiments of this invention, it is to be understood that the invention is not limited to this precise system, apparatus, process and method, and that changes may be made therein without departing from the scope of the invention which is defined in the appended claims.

What is claimed is:

1. A lighting module for an automotive vehicle, comprising:
    a support including heat dissipation elements, the support comprising a first generally planar surface;
    a light guide;
    at least one light source of a first type;
    at least one light source of a second type; and
    a printed circuit board accommodating the at least one light source of a first type, the printed circuit board comprising an edge and being in direct contact with the first planar surface,
    wherein the arrangement of the at least one light source of the first type and the second type is such that the at least one light source of the first type and the at least one light source of the second type are configured to emit light rays in the direction of an entry face of the light guide of the lighting module, the at least one light source of the first type generates less heat than the at least one light source of the second type, the at least one light source of the second type is in direct contact with the first planar surface and is housed on the support adjacent to the edge of the printed circuit.

2. The lighting module according to claim 1, wherein the at least one light source of the second type is electrically connected to the printed circuit board.

3. The lighting module according to claim 2, wherein a connection between the at least one light source of the second type and the printed circuit board is made via bridging by a metal wire.

4. The lighting module according to claim 2, wherein the at least one light source of the first type and of the second type are supplied with electricity by shared means for controlling the power supply.

5. The lighting module according to claim 1, wherein the at least one light source of the first type and of the second type are supplied with electricity by shared means for controlling a power supply.

6. The lighting module according to claim 1, wherein the printed circuit board is fixed to the support by crimping or by bonding.

7. The lighting module according to claim 1, wherein the light source of the second type is fixed to the support by bonding.

8. The lighting module according to claim 7, wherein the bonding is carried out using a thermally conductive adhesive.

9. The lighting module according to claim 1, wherein the heat dissipation elements comprise aluminum.

10. The lighting module according to claim 1, wherein the at least one light source of the first type emits light of a first color and the at least one light source of the second type is emits light of a second color.

11. The lighting module according to claim 1, wherein the at least one light source of the first type is intended to carry out a first lighting function, and the at least one light source of the second type is intended to carry out a second lighting function.

12. The lighting module according to claim 11, wherein the at least one light source of the first type is a turn indicator configured to operate intermittently and at least one light source of the second type is a daytime running light.

13. The lighting module according to claim 1, wherein the at least one light source of the first type and the second type are semiconductor element light sources.

14. The lighting module according to claim 1, wherein the at least one light source of the first type and the second type and the light guide are arranged so that the at least one light source of the first type emits light rays in the direction of a first entry face of the light guide, and so that the at least one light source of the second type emits light rays in the direction of a second entry face, different from the first entry face, of the same light guide.

15. The lighting module according to claim 1, wherein the at least one light source of the first type and the second type and the light guide are arranged so that the at least one light source of the first and of the second type emit light rays in the direction of the same entry face of the light guide.

16. The lighting module according to claim 15, wherein the at least one light source of the first type and the second type are light-emitting diode (LED) light sources.

17. The lighting module according to claim 1, wherein the at least one light source of the first type emits an amber color and the at least one light source of the second type emits a white color.

* * * * *